(12) United States Patent
Curello et al.

(10) Patent No.: US 7,078,325 B2
(45) Date of Patent: Jul. 18, 2006

(54) PROCESS FOR PRODUCING A DOPED SEMICONDUCTOR SUBSTRATE

(75) Inventors: Giuseppe Curello, Dresden (DE); Jürgen Faul, Radebeul (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/904,360

(22) Filed: Jul. 12, 2001

(65) Prior Publication Data

US 2002/0016049 A1 Feb. 7, 2002

(30) Foreign Application Priority Data

Jul. 12, 2000 (DE) ......................................... 100 34 942

(51) Int. Cl.
*H01L 21/22* (2006.01)

(52) U.S. Cl. ..................... 438/542; 438/308; 438/309; 438/521; 438/529; 438/582; 438/586

(58) Field of Classification Search ................ 438/542, 438/308, 309, 558, 30, 233, 305, 515, 300, 438/582, 586, 182, 174, 521, 529
See application file for complete search history.

(56) References Cited

U.S. PATENT DOCUMENTS

| | | | |
|---|---|---|---|
| 4,478,655 A | * | 10/1984 | Nagakubo et al. ........... 438/151 |
| 4,617,066 A | * | 10/1986 | Vasudev ..................... 438/515 |
| 4,853,342 A | * | 8/1989 | Taka et al. ................... 438/283 |
| 5,296,388 A | * | 3/1994 | Kameyama et al. .......... 438/370 |
| 5,792,700 A | * | 8/1998 | Turner et al. ............... 438/166 |
| 5,843,829 A | | 12/1998 | Kuramae et al. |
| 5,963,801 A | | 10/1999 | Aronowitz et al. |
| 5,989,963 A | | 11/1999 | Luning et al. |
| 6,048,781 A | | 4/2000 | Turner et al. |
| 6,297,120 B1 | * | 10/2001 | Koiwa ........................ 438/358 |
| 6,362,063 B1 | * | 3/2002 | Maszara et al. ............ 438/307 |
| 6,399,450 B1 | * | 6/2002 | Yu ............................. 438/300 |
| 2001/0006039 A1 | * | 7/2001 | Cho et al. ..................... 117/13 |

FOREIGN PATENT DOCUMENTS

EP 0 889 502 A2 1/1999

OTHER PUBLICATIONS

Noda et al.: "0.1 µm Delta–doped MOSFET using Post Low–energy Implanting Selective Epitaxy" 1994 Symposium on VLSI Technology Digest of Technical Papers, pp. 19–20.
Priolo et al.: "Interface evolution and epitaxial realignment in polycrystal/single crystal Si structures" 1994 Elsevier Science B.V. 1994, Nuclear Instruments and Methods in Physics Research B85, pp. 159–166.
Ran–Hong Yan et al.: "Scaling the Si MOSFET: From Bulk to SOI to Bulk", IEEE Transactions on Electron. Devices, vol. 39, No. 7, Jul. 1992, pp. 1704–1711.
Thompson et al.: "MOS Scaling: Transistor Challenges for the 21$^{st}$ Century" Intel Technology Journal Q3'98, pp. 1–19.
Curello et al.: "Beam–power heating effect on the synthesis of graded composition epitaxial $Si_{1-x}Ge_x$ alloy layers" Elsevier Science B.V., 1997, Nuclear Instruments and Methods in Physics Research B 129, pp. 377–386.

* cited by examiner

*Primary Examiner*—B. William Baumeister
*Assistant Examiner*—Igwe U. Anya
(74) *Attorney, Agent, or Firm*—Laurence A. Greenberg; Werner H. Stemer; Ralph E. Locher

(57) ABSTRACT

A process is described which allows a buried, retrograde doping profile or a delta doping to be produced in a relatively simple and inexpensive way. The process uses individual process steps that are already used in the mass production of integrated circuits and accordingly can be configured for a high throughput.

17 Claims, 3 Drawing Sheets

PROCESS FOR PRODUCING A DOPED SEMICONDUCTOR SUBSTRATE

BACKGROUND OF THE INVENTION

Field of the Invention

The invention relates to a process for producing a doped semiconductor substrate. The present invention relates in particular to a process for producing what are known as "retrograde" or "buried retrograde" doping profiles in semiconductor substrates, as are used, for example, for the fabrication of large-scale integrated CMOS circuits.

The continuing miniaturization of integrated circuits, in particular CMOS circuits, requires increasingly small MOS transistors. In this context, in particular the channel length of the MOS transistors is being reduced to an increasing extent. Unfortunately, however, the increasingly small MOS transistors have properties that are no longer correctly described by the conventional transistor models that are directed at transistors with a channel length of more than about 2 µm. Accordingly, these properties are often combined under the heading "short-channel effects". One example of a significant short-channel effect is the influence of the gate size on the threshold voltage ($V_T$) of the transistor. In transistors with channel lengths of shorter than 0.7 µm, the threshold voltage is generally reduced with an increasingly short channel length ($V_T$ roll-off)

To compensate for the short-channel effects, hitherto the doping in the channel between the source and the drain has been increased. Therefore, by way of example, in the case of transistors with a channel length of 0.25 µm, doping of approximately $3 \times 10^{17}$ per $cm^2$ is used. However, a high channel doping of this nature leads to a reduced mobility of the charge carriers in the channel. Furthermore, high channel doping leads to a relatively high threshold voltage. Both effects of the relatively high channel doping are generally undesirable. Therefore, it has been proposed to bypass these difficulties by using what are known as "retrograde" doping profiles in the channel region. Retrograde doping profiles are characterized by the fact that, starting from the surface of the semiconductor substrate, the doping, at least across a predetermined region, rises with increasing depth. It has been found that doping profiles of this nature are able to successfully compensate for short-channel effects without the mobility of the charge carriers being significantly impaired. What are known as delta doping profiles, in which the doping is restricted to a very small spatial region, are also able to successfully compensate for short-channel effects without the mobility of the charge carriers being significantly impaired. In both cases, it is desirable for the maximum doping to be brought as close as possible to the surface of the semiconductor substrate while at the same time maintaining low doping at the surface.

Unfortunately, steep, retrofit doping profiles or delta doping profiles of this nature cannot be produced using the conventional doping processes employed in mass production. Therefore, a few alternatives for the production of steep, retrofit doping profiles have been proposed. U.S. Pat. No. 5,963,801 (Aronowitz et al.) describes a process for forming a retrograde doping profile that is based on a dopant implantation at energy levels of 150 to 220 keV using the channeling effect. If the dopant implantation is oriented along a preferred crystallographic direction of the silicon crystal, the dopant can penetrate significantly more deeply into the silicon substrate than would otherwise be possible with the same level of implantation energy. U.S. Pat. No. 5,989,963 (Luning et al.) describes a process for producing a retrograde doping profile that is based on a dopant implantation with a subsequent heat treatment in a highly pure inert gas atmosphere using the transient enhanced diffusion (TED) effect. However, both processes are relatively difficult to control and monitor, so that they have not so far been able to establish themselves in industrial production.

The publication titled "0.1 µm Delta-doped MOSFET Using Post Low-energy Implanting Selective Epitaxy" by K. Noda et al. Symposium on VLSI Technology Digest of Technical Papers 3A.2 (1994) describes a process for producing a delta doping profile by the use of selective silicon epitaxy. However, the process is very complex and therefore unsuitable for industrial application, which is dependent in particular on throughput and reproducibility.

SUMMARY OF THE INVENTION

It is accordingly an object of the invention to provide a process for producing a doped semiconductor substrate which overcomes the above-mentioned disadvantages of the prior art processed of this general type, which can produce steep doping profiles and is suitable for use in mass production.

With the foregoing and other objects in view there is provided, in accordance with the invention, a process for producing a doped semiconductor substrate. The process includes the following steps: providing a semiconductor substrate; producing a doping at a surface of the semiconductor substrate; applying a layer selected from the group consisting of a polycrystalline layer and an amorphous layer to the surface; and carrying out a heat treatment step for producing an epitaxial layer and a buried doping.

The process according to the invention can be used to produce a buried, precisely defined doping layer in a monocrystalline semiconductor substrate. The doping layer lies at a predetermined depth of the semiconductor substrate, the depth being determined substantially by the thickness of the applied polycrystalline and/or amorphous layer (poly/α layer). The free selection of the thickness of the poly/α layer and, independently of this, the free selection of the doping concentration of the doping layer below allow a considerable freedom in the formation of the three-dimensional doping configuration, which is otherwise only possible with complex process steps such as selective epitaxy or molecular beam epitaxy (MBE). Although the process according to the invention has been developed with a view to the fabrication of MOS transistors in the deep sub-µm range (gate length <200 nm), the process is not restricted to applications for the fabrication of doping profiles of NMOS and PMOS transistor channels, but rather can be used wherever buried doping layers or delta doping are advantageous.

The heat treatment is preferably carried out at a temperature of approximately 600° to 700° C., particularly preferably 650° C. The low temperature minimizes the diffusion of the doping layer into the adjoining regions. Consequently, the doping layer remains highly doped and the diffusion of the doping material into the adjoining regions is minimized. Autodoping, i.e. the doping of a layer with little or no doping as a result of a doping material from the adjoining highly doped layer diffusing into it, can thus be reduced to a minimum. This is particularly advantageous if the poly/α layer, which is then crystallized in the process according to the invention, is intended to define the region of a transistor channel of high conductivity.

One difficulty when applying a monocrystalline (epitaxial) layer to a monocrystalline semiconductor substrate, in particular to a silicon semiconductor substrate, is the spontaneous formation of a natural oxide layer on the semiconductor substrate. The natural oxide can impede the monocrystalline growth of a further layer and may have an adverse effect on the electrical properties of the semiconductor substrate after the application of the further layer. Unfortunately, the formation of the natural oxide layer can only be prevented with considerable difficulty with the conventional processes for application of poly/α layers, for example an LPCVD process step. Therefore, according to one embodiment of the present invention, it is preferable if an ion bombardment is carried out prior to the final heat treatment, serving to destroy the natural oxide layer.

According to a further embodiment of the present invention, it is preferable if a rapid thermal annealing (RTA) process step is carried out prior to the final heat treatment. The RTA process step likewise destroys the oxide layer that may form between the poly/α layer and the substrate. The heating in the RTA process step is preferably so short that the doping profile of the doping layer remains substantially unchanged.

The vertical doping profile of the semiconductor substrate after application of the process according to the invention is composed of the doping profile of the poly/α layer, the doping profile of the doping layer and the doping profile of the lower layers below. Preferably, the poly/α layer is not doped during or after the deposition.

The doping on the substrate surface is preferably produced by implantation, in which case it is preferable to use doping materials with a low diffusion constant, such as for example Sb, As or In, so that the doping or doping layer has a sharply defined doping profile. Since the doping of the doping layer takes place prior to the application of the poly/α layer and can therefore take place from the surface of the doping layer, the doping can also be carried out by all other customary doping methods.

The vertical doping profile that results from the processes according to the invention is particularly suitable for the doping of a channel region for large-scale integrated MOS transistors. Both processes allow a low degree of doping at the semiconductor surface, the region in which the transistor channel current subsequently flows (previously the poly/α layer), and a high level of doping directly below the transistor channel (doping layer). The low level of doping in the channel region ensures a high charge carrier mobility, so that the slope of the transistor characteristic and therefore the switching speed of the transistor are high, while the high level of doping below the channel ensures good suppression of the punch-through between drain and source. The suppression of the punch-through therefore ensures that the MOS transistors remain controllable even with very short channel lengths, in particular channel lengths in the sub-μm range.

The semiconductor substrate is preferably made from monocrystalline silicon. However, it is also possible for other semiconductor materials, such as for example GaAs or germanium, to be used as the semiconductor substrate. The poly/α layer which is to be applied to the semiconductor substrate may also consist of various semiconductor materials. However, preferred materials are materials with a similar lattice structure to that of the semiconductor substrate, so that monocrystalline growth of the poly/α layer that is to be crystallized on the semiconductor substrate is ensured. Preferably, however, the poly/α layer is made from silicon, in particular if the semiconductor substrate is also made from silicon. The poly/α layer is preferably applied to the doped semiconductor substrate using an inexpensive low-pressure chemical vapor deposition (LPCVD) process. The temperature is preferably low during this step, so that the doping atoms of the adjoining doping layer substantially do not diffuse and the poly/α layer is not contaminated by diffusion of the diffusion materials from the doping layer (autodoping). A further advantage of the low temperature is the smaller grain size of the poly/α layer, which is predominantly amorphous at below 580° C. and facilitates subsequent crystallization. An example of a preferred temperature for the low-pressure CVD process step is 500° C. to 600° C.

The thickness of the poly/α layer can be selected freely in a wide range depending on the particular application. It may lie in the range from a few nanometers up to the micrometer range. For the application of the process according to the invention for the fabrication of an MOS transistor channel, the thickness of the poly/α layer is preferably about 20 nm to 40 nm.

According to a preferred embodiment of the present invention, an amorphous layer that extends to a predetermined depth into the semiconductor substrate is produced by ion bombardment before the heat treatment step. The thickness of the amorphous layer is substantially determined by the energy and atomic mass of the ions. It is preferable for ions which on the one hand are sufficiently heavy for amorphization of the semiconductor substrate and on the other hand are incorporated in the semiconductor lattice during the subsequent a crystallization in such a way that the semiconductor characteristics of the semiconductor substrate remain substantially unchanged in electronic terms to be selected for the bombardment. For a silicon substrate, it is preferable to use germanium ions, since they are heavier than silicon and can be incorporated in the silicon lattice without problems. However, it is also possible for the semiconductor substrate to be bombarded with silicon, noble gas and/or other ions, provided that they do not substantially change the electronic characteristics after the crystallization.

The amorphous layer preferably extends vertically through the poly/α layer, so that on the one hand the poly/α layer is completely amorphized, but on the other the hand natural oxide layer which has formed on the principal surface prior to the coating with the poly/α layer and is now embedded between the poly/α layer and semiconductor substrate is destroyed by the ion bombardment. The amorphous layer preferably extends so far into the semiconductor substrate that the boundary layer between amorphous layer and non-amorphized semiconductor substrate is sufficiently far away from the functional structures that are yet to be produced on the semiconductor substrate surface. The reason for this is that experience has shown that the boundary layer between the amorphous layer and the non-amorphized semiconductor substrate has a high level of lattice imperfections and lattice defects (end-of-range defects) after the crystallization, which may lead to high levels of leakage currents, traps or other defects and may therefore impair the functionality of transistors or other structures on the semiconductor substrate.

To produce a transistor channel using the process according to the invention, by way of example the layer thickness of the amorphous layer is preferably selected in such a way that it extends through the doping layer, so that the end-of-range defects lie at a lower level than the doping layer in the semiconductor substrate and therefore do not affect the transistor channel. A further advantage of the amorphous layer that extends through the doping layer is that the doping layer can be simultaneously annealed during the crystallization. The amorphous layer is preferably approximately 500 to 1000 nm thick.

The dose of ion bombardment is preferably to be selected in such a way that the amorphous layer is completely amorphized, in order then to grow again on the semiconductor substrate in monocrystalline form at low temperature. For germanium, a dose of preferably $3 \times 10^{14}$ cm$^{-2}$ is used for the amorphization.

After the amorphization, the amorphous layer is crystallized, i.e. is grown again in monocrystalline form on the non-amorphized semiconductor substrate (solid-phase epitaxy). This process step is preferably carried out by a heat treatment at a preferred temperature of between 600° and 700° C., preferably at 650° C., so that the doping profile of the doping layer is only affected to an insignificant extent. In particular, the low temperature makes it possible to ensure that only very small amounts of doping material diffuse into the region of the previous poly/α layer, so that this region maintains its high charge carrier mobility. The duration of this temperature step is dependent on the thickness of the amorphous layer that is to be crystallized. For an amorphous layer of about 500 nm, the duration is preferably only a few minutes.

According to a further embodiment of the present invention, a RTA process step which breaks up the natural oxide layer which is embedded between poly/α layer and doping layer is carried out before the heat treatment step. The RTA process step preferably heats the semiconductor substrate to a temperature of 1000° to 1100° Celsius with a preferred duration of 10 to 60 seconds. As a result of this high-temperature process step, the oxide layer is generally broken down into sub-nm oxide islands (SiO$_x$ sub-nm beads) that, however, do not present any problems for most applications.

Then, a solid-phase epitaxy is once again carried out. In this case, too, a low temperature of around 600° to 700° Celsius is preferred, so that the doping profile does not become blurred as a result of diffusion. However, it is only necessary to crystallize the poly/α layer, so that the crystallization process duration is shorter than the process with additional ion bombardment for the same layer structure.

Other features which are considered as characteristic for the invention are set forth in the appended claims.

Although the invention is illustrated and described herein as embodied in a process for producing a doped semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1A:
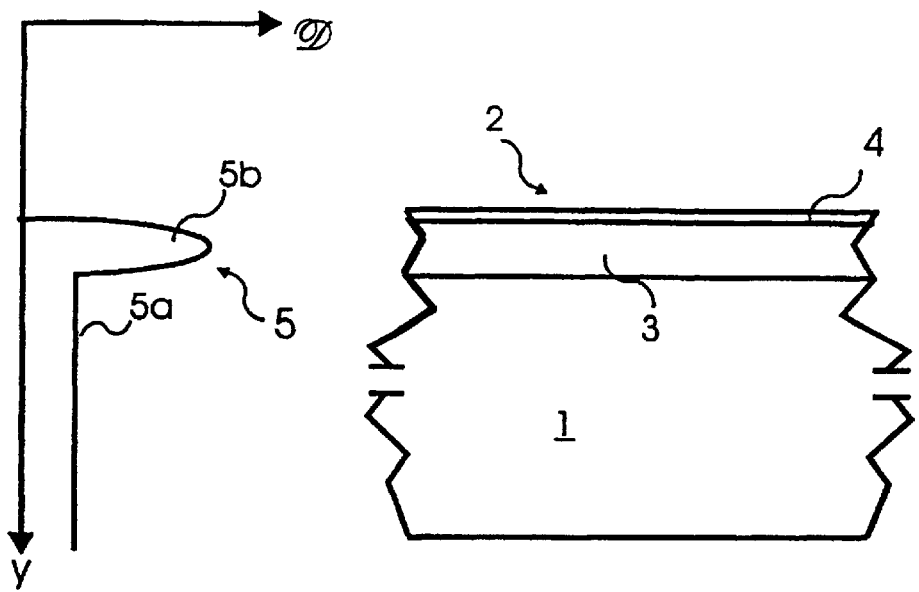
FIGS. 1a–1d are diagrammatic, partial, sectional views of steps of a first embodiment of a process according to the invention and associated vertical doping profiles.

In all the figures of the drawing, sub-features and integral parts that correspond to one another bear the same reference symbol in each case. Referring now to the figures of the drawing in detail and first, particularly, to FIGS. 1a–1d thereof, there is shown a first embodiment of a process according to the invention. The first embodiment is part of, for example, a sequence of process steps for the fabrication of MOS transistors with a very short gate length. The doping profile that is produced in accordance with the invention ensures, in a region of a transistor channel, that, a punch-through between a drain and a source is suppressed through a high implantation dose and, on the other hand, a good charge carrier mobility in the transistor channel is ensured on account of low doping.

FIG. 1a shows a semiconductor substrate 1 made from monocrystalline silicon with a principal surface 2, at which a doping 3 has been produced, preferably by ion implantation. A vertical doping profile 5 is composed of a doping profile of a semiconductor base substrate 5a, which in the embodiment is flat and is provided, for example, by the basic doping of the wafer or a doping well in which a transistor is to be embedded. A doping profile 5b of the doping layer 3 is provided by the doping process. If the doping is produced by ion implantation, the doping profile 5b of the doping layer 3 is substantially provided by a Gaussian distribution, the precise form of which is influenced by parameters such as implantation energy, atomic mass of the implant and dose.

In the embodiment shown, the doping is carried out preferably with boron ions for the NMOS channel and As or Sb ions for the PMOS channel, so that a doping profile in delta form is produced. FIG. 1a also shows a very thin natural oxide layer 4, which is formed on the doping layer 3 as a result of oxygen in the environment.

Figure 1B:
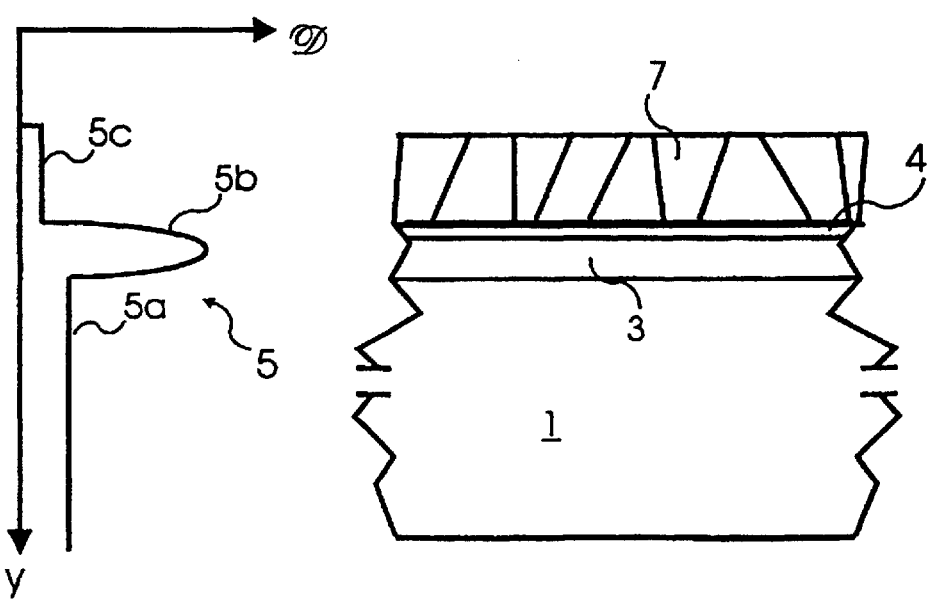

FIG. 1b shows the semiconductor substrate 1 after a poly/α layer 7 of silicon has been deposited on the principal surface 2. The deposition preferably takes place by a standard low-pressure chemical vapor deposition (LPCVD) process using preferably undoped silicon. The deposition is preferably carried out in one step for the PMOS and NMOS channels. The thickness of the poly/α layer 7 is preferably sufficient to encompass the subsequent transistor channel cross section. It is preferably 20 nm to 40 nm. On account of the absence of a subsequent or in-situ doping step, the doping profile of the poly/α layer 5c is very low. However, it is also possible to use doped poly/α layers. Since in this embodiment the poly/α layer defines the transistor channel region, however, a doping which is as low as possible is desirable, in order to obtain a layer with very good charge carrier mobility after the crystallization.

The temperature during the LPCVD process is preferably low, preferably between 500° C.–600° C., so that the doping profile of the doping layer 5b cannot run out and penetrate into the poly/α layer as a result of high levels of diffusion. Moreover, a grain size of the poly/α layer 7 becomes smaller at increasingly low temperatures, which facilitates subsequent flawless crystallization. The natural oxide layer 4 is now embedded between the poly/α layer 7 and the doping layer 3.

Figure 1C:
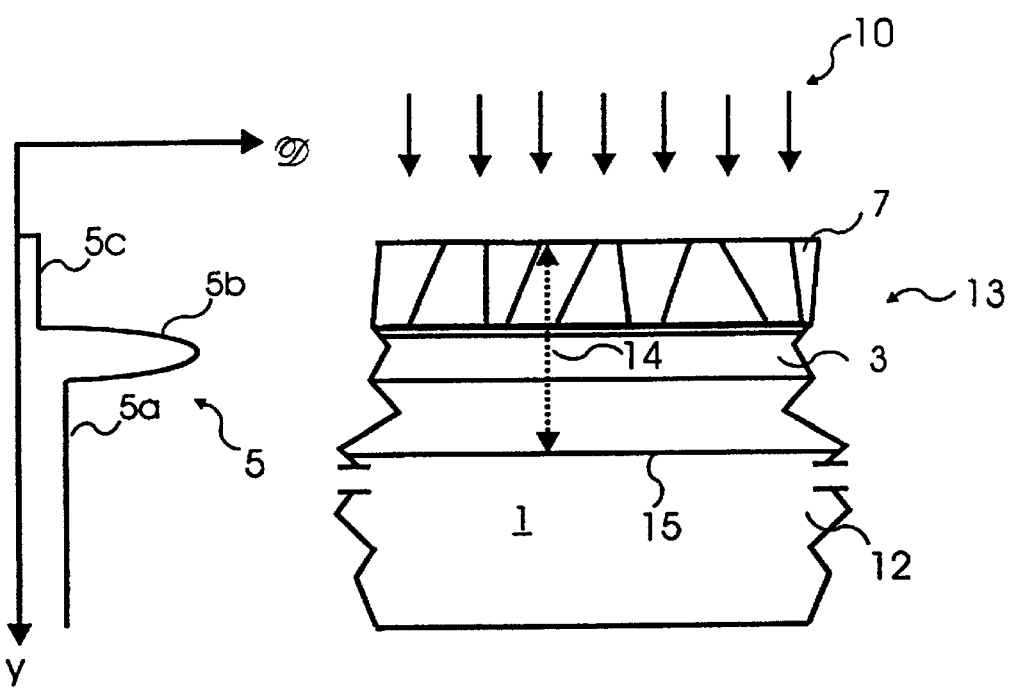

FIG. 1c shows the semiconductor substrate 1 during an ion bombardment 10 for producing an amorphous layer 13 (post-amorphization). Amorphization is preferably carried out using heavy ions, in particular using germanium ions, which are subsequently incorporated in the silicon lattice without significantly changing the electrical properties of the silicon lattice. The thickness of the amorphous layer 13 is indicated by a double arrow 14. The amorphous layer 13 extends vertically through the poly/α layer 7 and preferably through the doping layer 3 down to a predetermined depth of the semiconductor substrate 1, to a line 15, which represents the amorphous/crystalline transition after the ion bombardment.

The amorphous/crystalline transition is important because it is impossible to bring about complete amorphization at the boundary region of the ion bombardment, so that lattice defects (end-of-range defects) remain in that region during the crystallization, which may lead to high levels of leakage current, traps or the like and may impair the function of the transistor. For this reason, the thickness of the amorphous layer 13 is selected to be sufficiently great for the end-of-range defects to lie outside the region of influence of the subsequent transistor channel region. A preferred thickness of the amorphous layer 13, the arrow 14, in the embodiment is 500 nm to 1000 nm.

In addition to the fact that the end-of-range defects are forced a greater depth into the semiconductor substrate 1, the ion bombardment 10 also destroys the natural oxide layer 4, so that a continuously monocrystalline, epitaxial layer can be produced by the subsequent heat treatment (solid-phase epitaxy).

Figure 1D:
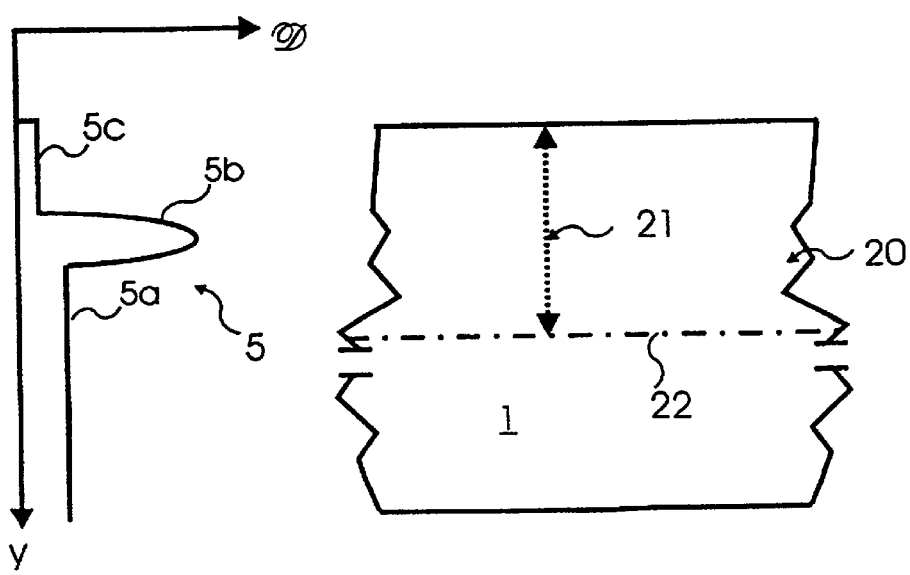

FIG. 1d shows the semiconductor substrate 1 after the crystallization. The crystallization preferably takes place by a heat treatment at low temperature, preferably at 650° C., in order to ensure that the doping profile of the doping layer does not become blurred as a result of high levels of diffusion. The material of the amorphous layer 13 with the thickness 14 characterized by the double arrow has grown in monocrystalline form onto the non-amorphized semiconductor substrate 12 (solid-phase epitaxy), so that an epitaxial layer 20 has been formed. After this process step, only a thin layer with end-of-range defects 22 remains. The region is the transition region between what was formerly the non-amorphized semiconductor substrate 12 (FIG. 1c) and the amorphous layer 13, which does not merge flawlessly during the crystallization. Since this region lies outside the doping layer, as seen from the transistor channel, the defects there cannot influence the performance of the transistor.

FIG. 1d also shows that the natural doping layer 4 has disappeared, so that a substantially flawless transition is produced between the doping layer 3 and what was previously the poly/α layer 7. It can also be seen that the doping profile 5 has not changed or has only changed to an insignificant extent during the process step.

Finally, it is preferable to carry out a wet etching operation, in order to remove oxide residues from the surface of the epitaxial layer 20 and to improve the surface quality for a gate oxide that is then to be applied.

To increase the throughput, the solid-phase epitaxy may also be carried out in one operation at the same time as the production of the gate oxide. It is thus possible to dispense with an additional heat treatment for the solid-phase epitaxy.

In this case, the wet etching for removal of oxide residues is carried out before the solid-phase epitaxy.

Figure 2A:
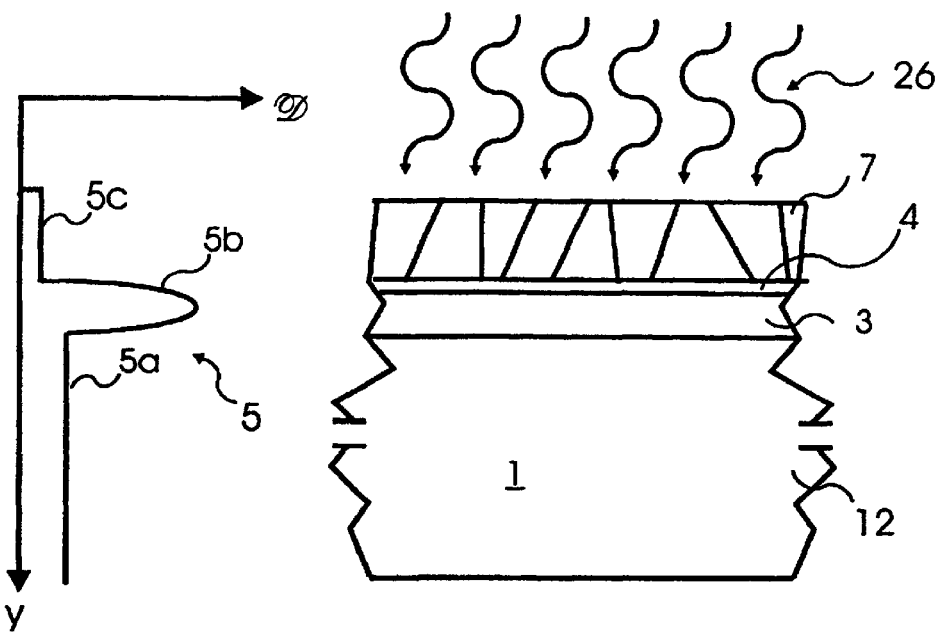
FIGS. 2a–2b are partial sectional views of a second embodiment of the process according to the invention and the associated vertical doping profiles.
Figure 2B:
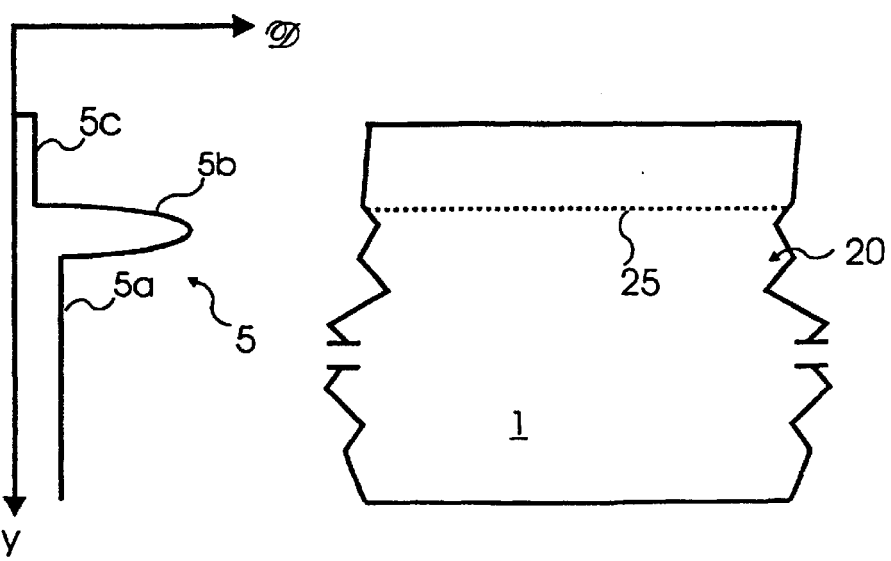

FIGS. 2a and 2b show a second embodiment of the process according to the invention for the same application as in the embodiment described above. The first steps are identical to the steps shown in FIGS. 1a and 1b. Now, however, to destroy the natural oxide layer 4, there is no ion bombardment of the semiconductor substrate 1, instead a rapid thermal annealing (RTA) process step is carried out. The high-temperature process step destroys the natural oxide layer 4 to such an extent that only sub-nm $SiO_x$ oxide islands 25 which have no influence whatsoever on the function of the transistor channel remain. The high-temperature process step is preferably carried out using a RTA furnace at a temperature of approximately 1050° C. and for 20 seconds.

The high-temperature step is followed by a heat treatment of the semiconductor substrate at low temperatures, as in the first embodiment described above. The temperature is once again about 600° C.–700° C., preferably about 650° C. However, the duration of the heat treatment may be shorter, since now only the poly/α layer, with a layer thickness of 20 nm to 40 nm, has to be crystallized and therefore converted into an epitaxial layer. As in the first exemplary embodiment, a wet etching operation is preferably carried out after the heat treatment, in order to eliminate oxide residues on the surface and to improve the quality of the semiconductor substrate surface before the gate oxide is applied.

Next, the gate oxide, the gate electrode and the source and drain regions of the transistors can be produced using conventional methods, which are not explained in further detail here.

The process according to the invention enables a retrograde doping profile or a delta doping to be produced in a relatively simple and inexpensive way. The process according to the invention uses individual process steps that are already used in the mass production of integrated circuits and can accordingly be configured for a high throughput.

We claim:

1. A process for producing a doping for a MOS transistor, which comprises the following steps:

providing a semiconductor substrate;

producing a doping at a surface of the semiconductor substrate;

after producing the doping, applying a layer selected from the group consisting of a polycrystalline layer and an amorphous layer to the surface;

performing a rapid thermal annealing process; and subsequently carrying out a heat treatment step for producing an epitaxial layer and a buried doping for a MOS transistor.

2. The process according to claim 1, which comprises forming the further amorphous layer to have a thickness of between 500–1000 nm.

3. The process according to claim 1, which comprises carrying out the rapid thermal annealing process out at a temperature of between 1000° and 1100° C.

4. The process according to claim 1, which comprises carrying out the rapid thermal annealing process for a time period of between 10 and 60 seconds.

5. The process according to claim 1, which comprises forming the semiconductor substrate from silicon.

6. The process according to claim 1, which comprises forming the polycrystalline layer and the amorphous layer from silicon.

7. The process according to claim 1, which comprises producing the doping by an ion implantation process.

8. The process according to claim 7, which comprises carrying out the ion implantation process using ions selected from the group consisting of B, P, As, In and Sb ions.

9. A process for producing a doping for a MOS transistor, which comprises the following steps:

providing a semiconductor substrate;

producing the doping, depositing a poly/α layer using a low-pressure and low-temperature chemical vapor deposition process to the surface of the semiconductor substrate; and carrying out a heat treatment step for producing an eptiaxial layer and a buried doping for a MOS transistor.

10. The process according to claim 9, which comprises carrying out a crystallization of the poly/α layer by performing a low-temperature step.

11. The process according to claim 10, which comprises carrying out the low-temperature step at a temperature of between 600° C. to 700° C.

12. The process according to claim 10, which comprises carrying out a wet etching operation out after performing the a low-temperature step.

13. The process according to claim 10, which comprises performing the crystallization at a same time as a formation of a gate oxide.

14. The process according to claim 10, which comprises carrying out the low-temperature step at a temperature of 650° C.

15. The process according to claim 9, which comprises depositing the poly/α layer at a temperature of between 500° C. and 600° C.

16. A process for producing a doping for a MOS transistor, which comprises the following steps:

providing a semiconductor substrate;

producing a doping at a surface of the semiconductor substrate;

after producing the doping, depositing a poly/α layer to a thickness between 20 nm to 40 nm using a low-pressure chemical vapor deposition process to the surface of the semiconductor substrate; and carrying out a heat treatment step for producing an epitaxial layer and a buried doping for a MOS transistor.

17. A process for producing a MOS transistor with a buried doping, which comprises the following steps:

providing a semiconductor substrate;

producing a doping at a surface of the semiconductor substrate;

after producing the doping, applying a layer selected from the group consisting of a polycrystalline layer and an amorphous layer to the surface;

subjecting the assembly to ion bombardment or to RTA processing with a rapid heat treatment to thereby destroy an oxide layer present between the semiconductor substrate and the polycrystallinge or amorphous layer; and subjecting the assembly to a heat treatment step for producing a monocrystalline layer and a buried doping from the layers and the semiconductor substrate for forming the MOS transistor.

* * * * *